United States Patent [19]
Baker et al.

[11] Patent Number: 6,082,526
[45] Date of Patent: *Jul. 4, 2000

[54] PARTS PROCESSING SYSTEM WITH NOTCHED CONVEYOR BELT TRANSPORT

[75] Inventors: Richard Lee Baker, Hallstead, Pa.; James Francis Chesko, Windsor, N.Y.; Allan Oberg Johnson, Johnson City, N.Y.; Wayne David Klossner, Vestal, N.Y.; Mark Alexander Willchock, Hallstead, Pa.; Paul Robert Wilson, Newark Valley, N.Y.

[73] Assignee: International Business Machines Corporation, Armonk, N.Y.

[*] Notice: This patent is subject to a terminal disclaimer.

[21] Appl. No.: 09/340,874

[22] Filed: Jun. 28, 1999

Related U.S. Application Data

[63] Continuation of application No. 08/853,778, May 9, 1997, Pat. No. 5,915,525, which is a continuation of application No. 08/432,222, May 1, 1995, abandoned.

[51] Int. Cl.[7] .................................................. B65G 15/10
[52] U.S. Cl. .................... 198/817; 198/626.1; 198/604; 198/575
[58] Field of Search .............................. 198/817, 626.1, 198/604, 575

[56] References Cited

U.S. PATENT DOCUMENTS

| | | | |
|---|---|---|---|
| 4,802,571 | 2/1989 | Born et al. | 198/817 |
| 5,029,696 | 7/1991 | Van Tilburg | 195/626.1 |
| 5,074,402 | 12/1991 | Bender-Zanoni et al. | 198/817 |
| 5,368,643 | 11/1994 | Kuster | 118/324 |
| 5,553,698 | 9/1996 | Patois et al. | 198/626.1 |
| 5,915,525 | 6/1999 | Baker et al. | 198/817 |

FOREIGN PATENT DOCUMENTS

| | | | |
|---|---|---|---|
| 1225134 | 9/1966 | Germany | 198/626.1 |
| 4138338 | 5/1993 | Germany | 198/817 |
| 225215 | 9/1990 | Japan | 198/626.1 |

OTHER PUBLICATIONS

Brandt and Haegele, Flexible wire Turnover Conveyor, Technical Digest No. 26, Apr. 1972, pp. 11 & 12, 198/626.1.

*Primary Examiner*—Christopher P. Ellis
*Assistant Examiner*—Khoi H. Tran
*Attorney, Agent, or Firm*—James A. Lucas; Driggs, Lucas, Brubaker & Hogg Co., L.P.A.

[57] ABSTRACT

An apparatus and system for wet/dry and other processing of manufactured articles. Belts mounted on pulleys provide support while minimally contacting article surfaces for maximum exposure to chemical, radiation, or other wet/dry processing treatments.

12 Claims, 6 Drawing Sheets

PARTS PROCESSING SYSTEM WITH NOTCHED CONVEYOR BELT TRANSPORT

CROSS REFERENCE TO RELATED APPLICATION

This application is a continuation of patent application Ser. No. 08/853,778, filed May 9, 1997, now U.S. Pat. No. 5,915,525, which is a continuation of patent application Ser. No. 08/432,222, filed May 1, 1995, now abandoned.

FIELD OF THE INVENTION

This invention relates to wet, dry, and other types of processing of articles in a manufacturing production environment. In particular, this invention provides a reliable transport system for moving small parts through a processing area, thereby providing volume processing capability for small articles without requiring manual handling by manufacturing personnel.

BACKGROUND OF THE INVENTION

Current available horizontal processing conveyor systems for the electronic circuit board industry typically consist of a series of solid rollers and/or wheels mounted on rods to convey products through various wet/dry processes. This conveyor design realized certain limitations when it came to product size. Products less than approximately four inches long could not be conveyed from one roller to the next, falling instead between the rollers. An alternative method to convey small parts utilizes slots in the side rails (guides). The disadvantage to this method is the incomplete coverage of the processes along the edges captured by the slots. The industry is currently dividing up large panels into smaller pieces and a tool/apparatus to handle these smaller pieces was non-existent until now.

The apparatus and system disclosed herein successfully conveys and processes products smaller than the capability of conventional conveyor systems and thus fills a void in this emerging technology. Prior handling of small parts was done manually one piece at a time. Through automation this apparatus provides greater than 10X improvement in productivity. The apparatus being presented is currently processing IBM panel products and other substrate products. All articles which require delicate handling to avoid sensitive surfaces such as wafers, circuitized panels and ceramics can benefit from this invention.

It is an object of the invention to provide the capability for volume processing of small delicate parts.

It is another object of the invention to provide a processing system which exposes a maximum amount of product surface area to the processing treatment.

SUMMARY OF THE INVENTION

The present invention comprises belts each having a plurality of notched teeth, the notched teeth of the belts disposed such that a subset of the notched teeth of the first belt supports with notch edges one side of an article while a subset of the notched teeth of second belt supports with notched edges a second side of the article such that the article is suspended in space. By including a means for simultaneously propelling segments of each of the belts along substantially parallel paths, the supported article is transported for a predetermined distance through space. The space could be any number of process type and number. The transport of small articles is accomplished without any clamping which would inhibit full coverage of a process requirement.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
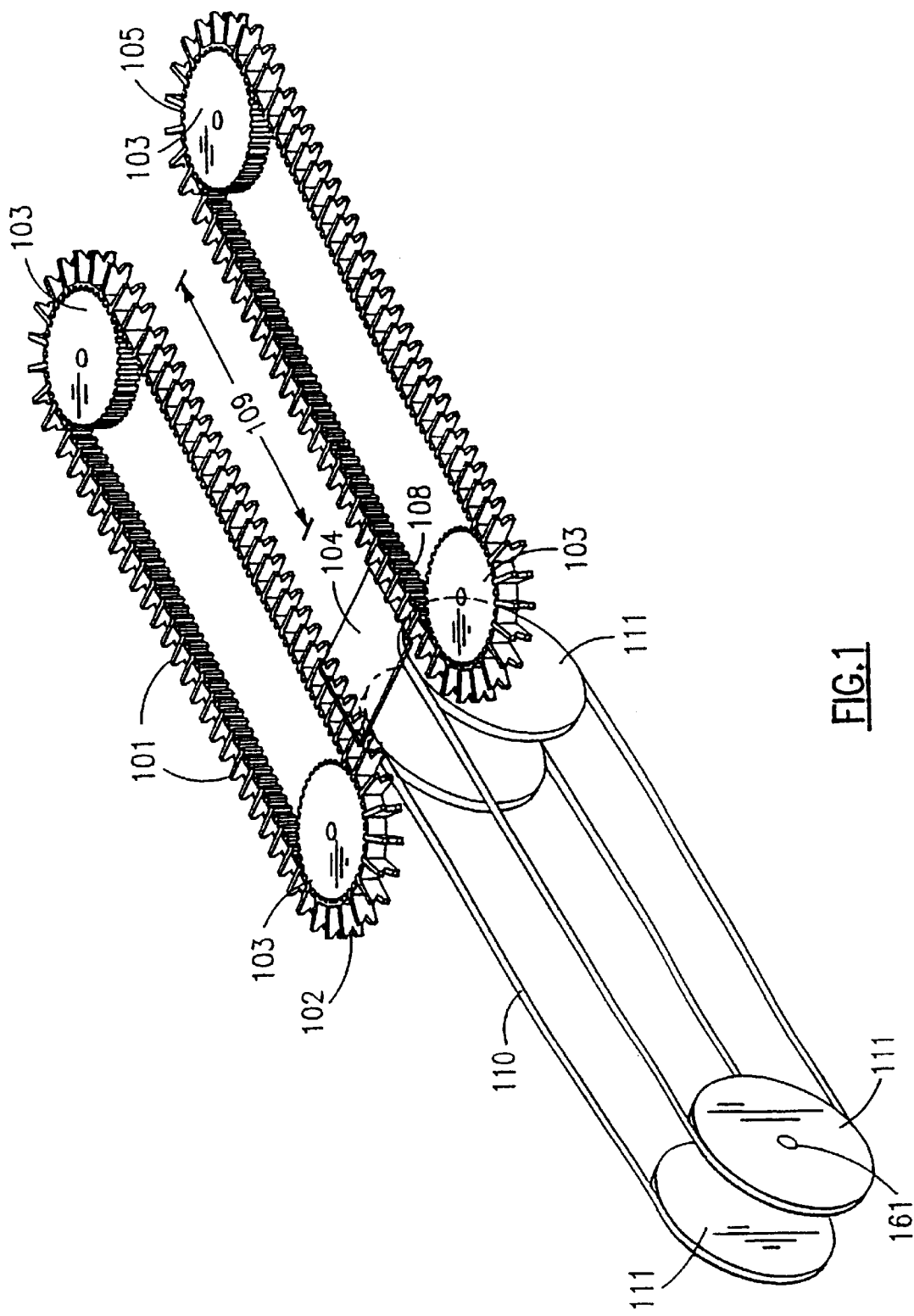
FIG. 1 illustrates a perspective view of the transport system with a receiving system.
Figure 2:
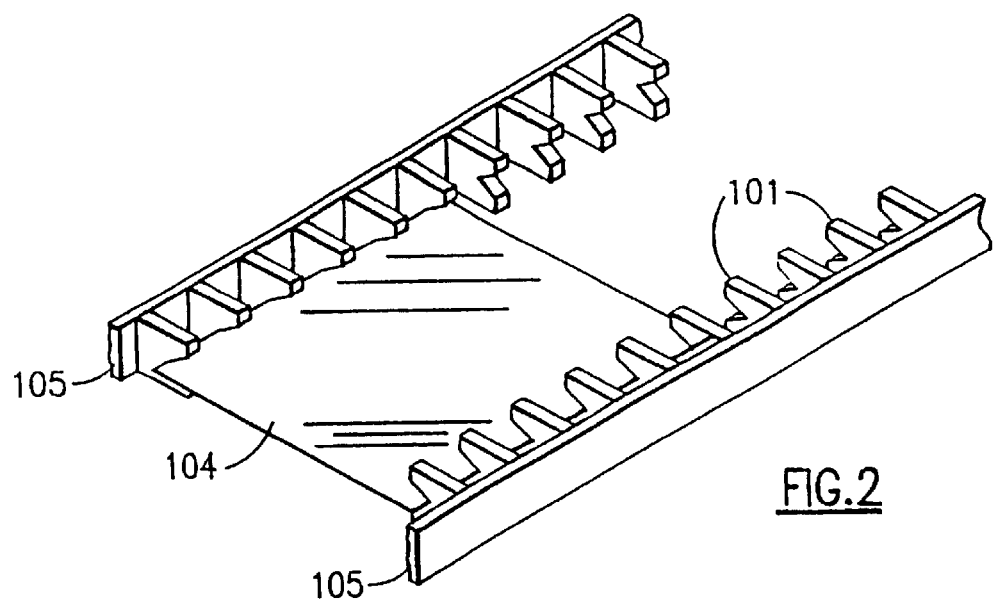
FIG. 2 illustrates and expanded view of the transported article supported by notched teeth edges.
Figure 3:
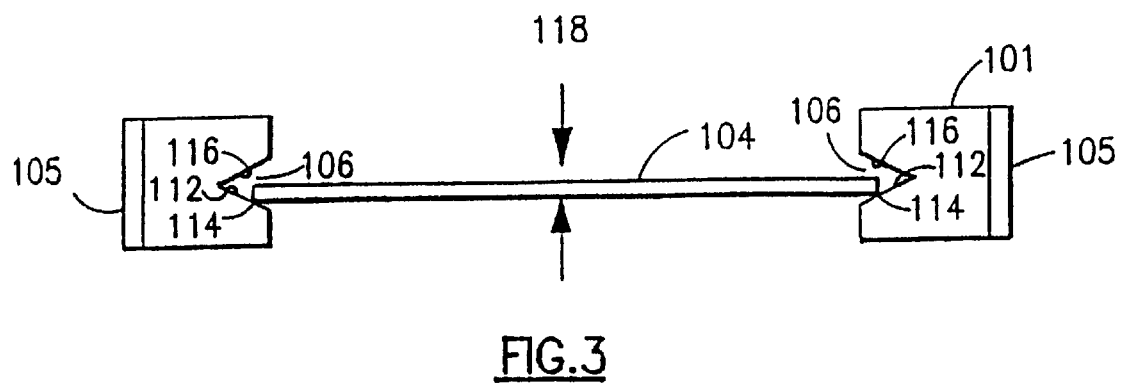
FIG. 3 illustrates an end view of FIG. 2 showing only the corners of the article in contact with notch edges.
Figure 6:
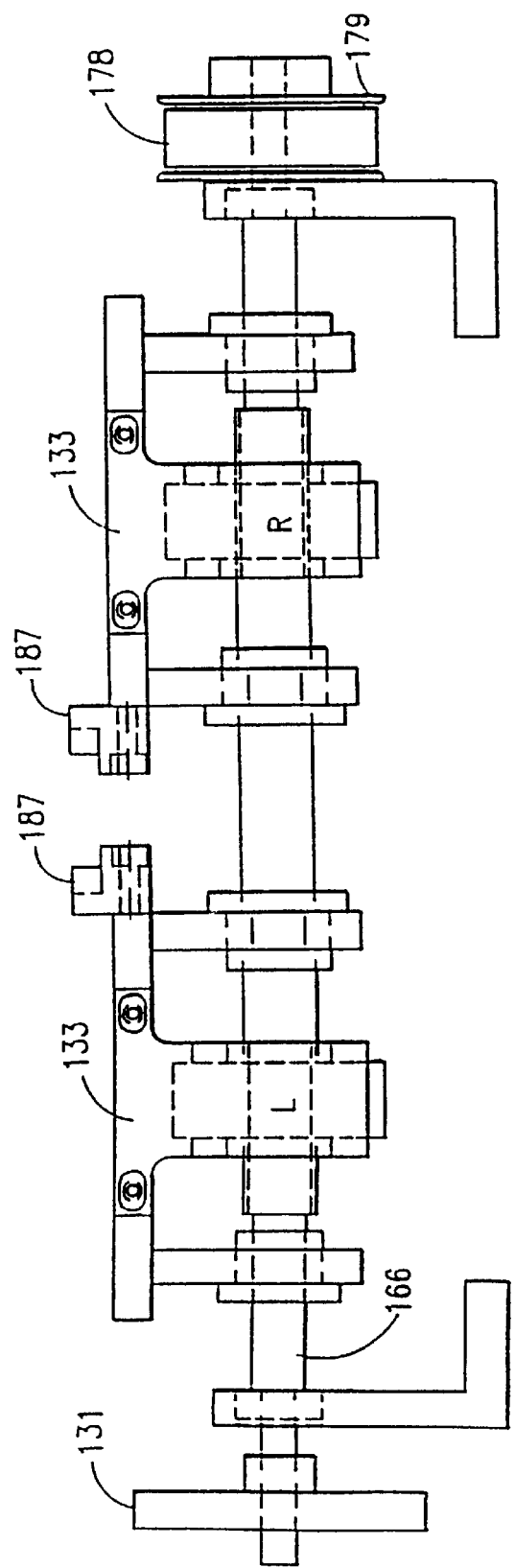
FIG. 6 illustrates an end view of FIG. 4.
Figure 7:
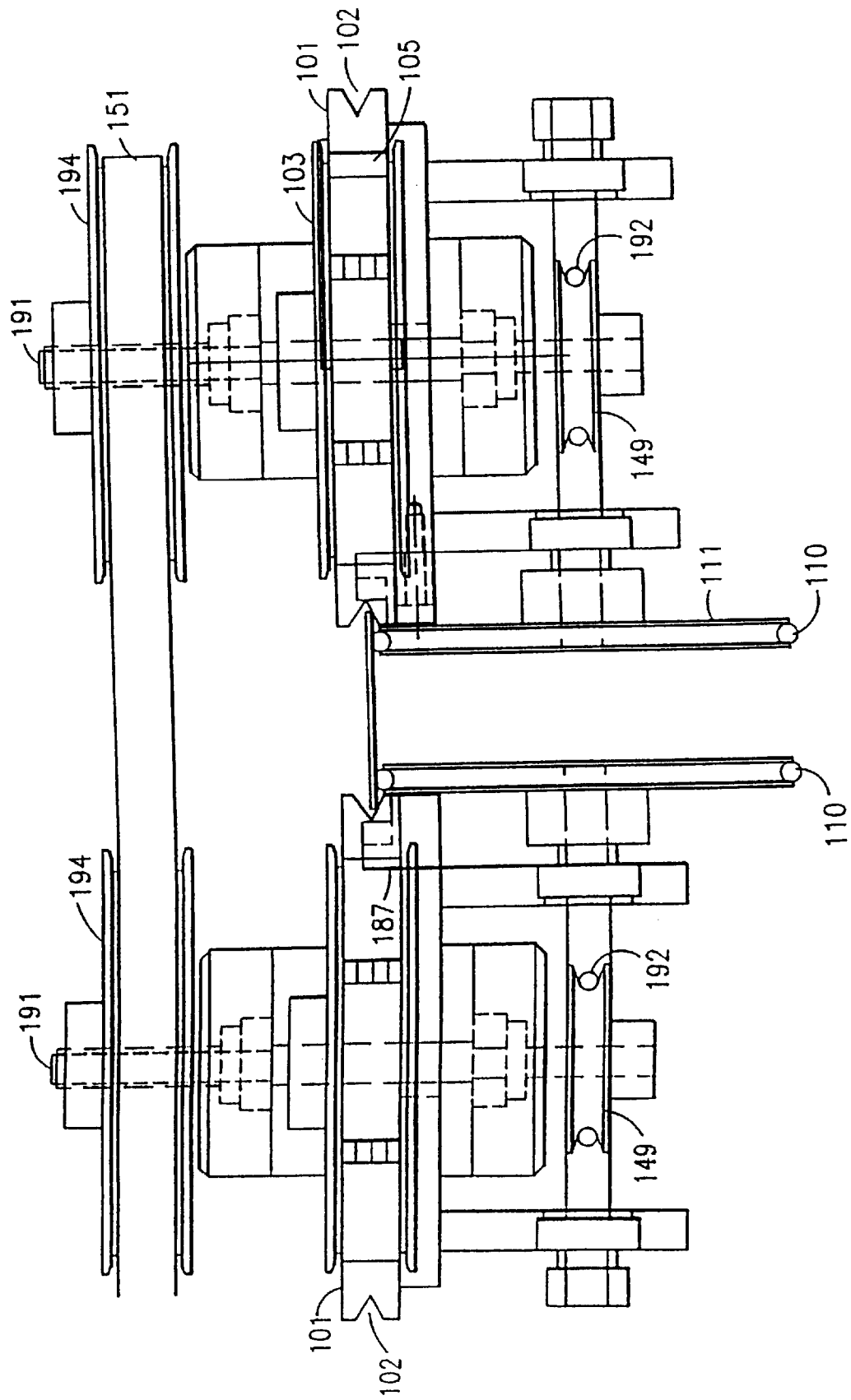
FIG. 7 illustrates an end view of FIG. 5.

Throughout the accompanying drawings, like numerals refer to like parts. Referring to FIGS. 1 and 2, the input drive system (loading system) consists of round belts 110 stretched over pulleys 111 that, with the aid of guide bars (see 187 FIGS. 6 and 7) to insure alignment, load the article 104 into a pair of belts 105 with teeth 101 having notches 102 formed therein. The belts are each also propelled by pulleys 103. The pulleys 103 can be toothed or smooth to match the inside surface 108 of the belts 105. The notch-teeth belts converge and receive the article delivered by the loading system into the space 102 between the notched edges then propel the article through a process area 109 for exposure to any type of processing, and ending at an unload point where the article 104 is transferred without stopping onto an unloading system operating similarly to the loading system described above. The unloading system (see FIG. 4) also includes a round belt 170 conveyor system with pulleys 193 and guides 188 which mirrors the input system.

Referring to FIGS. 4–7, another feature is the ability to adjust the guides 187 and 188 to compensate for various article widths via the crank 131 which rotates a threaded shaft 166 (threads not shown) and diverges or converges the guides. The apparatus is divided into two distinct mirror image halves 168 and 169 with each half connected to each other by two shafts 166 and 167, one at each end. The two shafts are connected to each other by a timing belt 178 and pulleys 179 such that when the hand crank 131 is turned the opposing nuts which reside on the shaft cause each half to move in opposite directions resulting in the variable width feature. The loading and unloading guides 187 and 188, respectively, diverge and converge in this manner. The apparatus can accommodate different product thickness 118 by combining the features of the notched belt with the variable width adjustment. Thicker articles would not rest as deeply into the notches as thinner articles would.

The system receives articles for processing and conveys these articles through any combination of wet and dry processes ending with an exit station (unloading system) for optional transfer to another process. The two transport belts 105 are custom made belts running simultaneously. While the article is captured in the transport belts it is not held tightly, i.e., there is gap 106 between the notch edges and article 104, and thus allows processes to make contact with all surfaces. The invention described as the transport mechanism makes possible any combination of processes, combining multiple work stations, adjustability for variable widths making this apparatus unique to the industry.

Figure 4A:
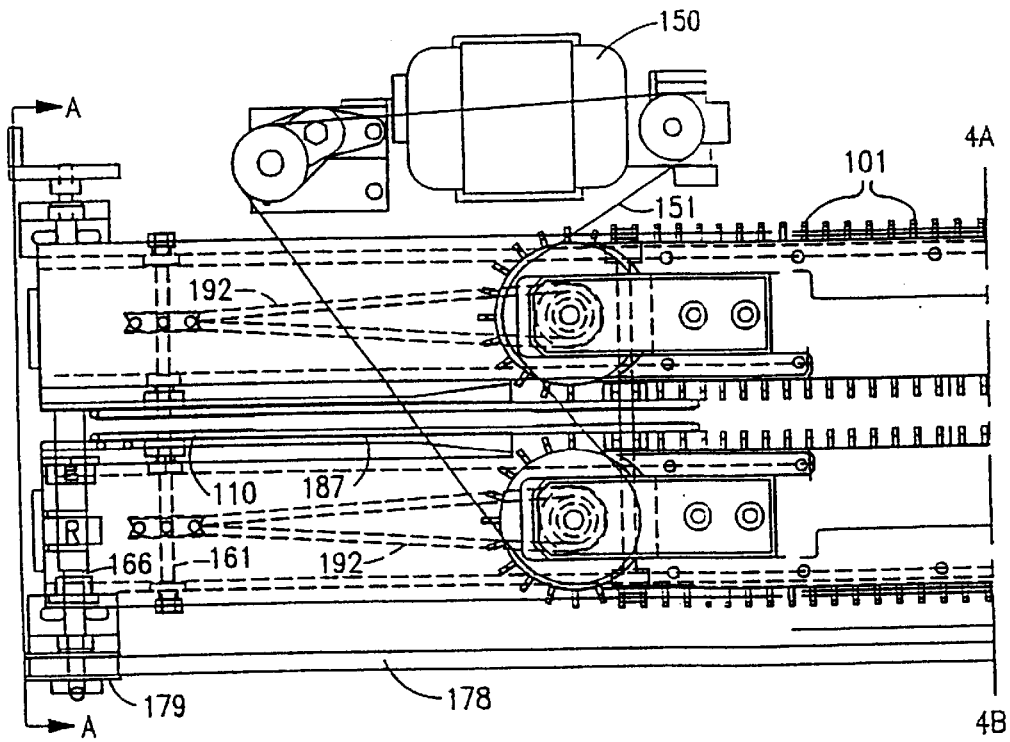
FIG. 4 illustrates an operating system utilizing the transport system of FIG. 1.
Figure 5A:
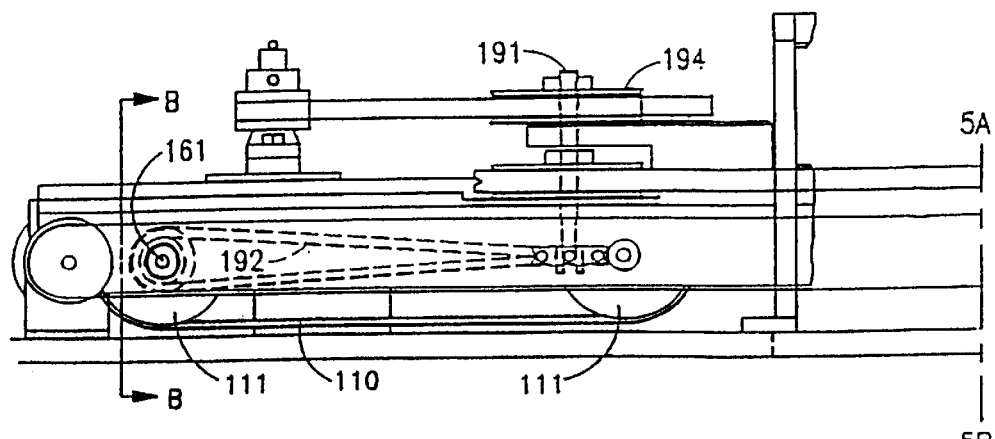
FIG. 5 illustrates a side view of FIG. 4.
Figure 4B:
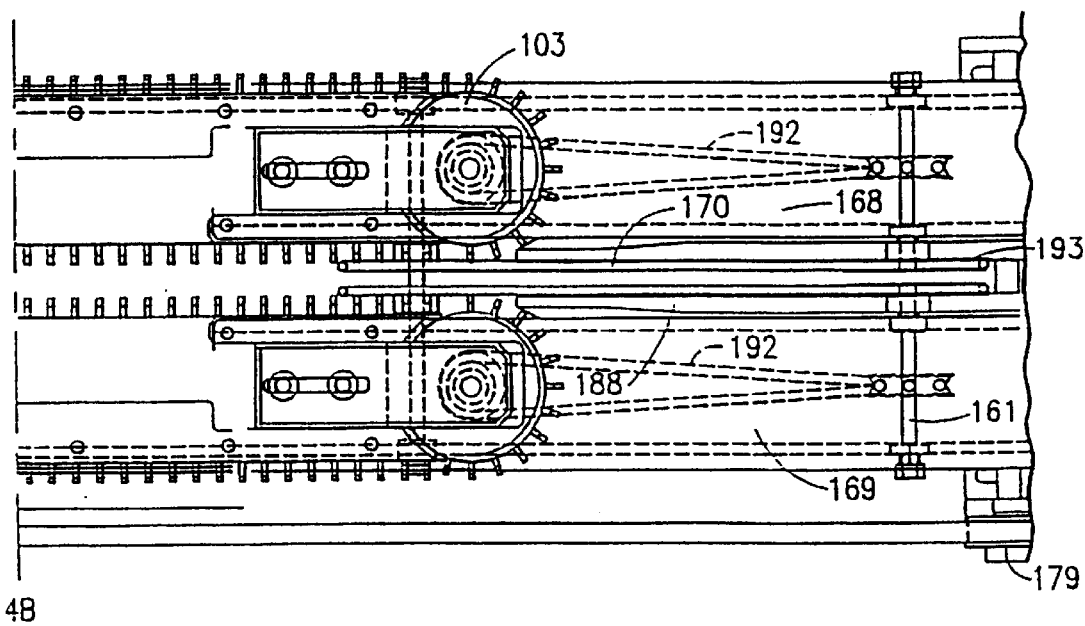
Figure 5B:
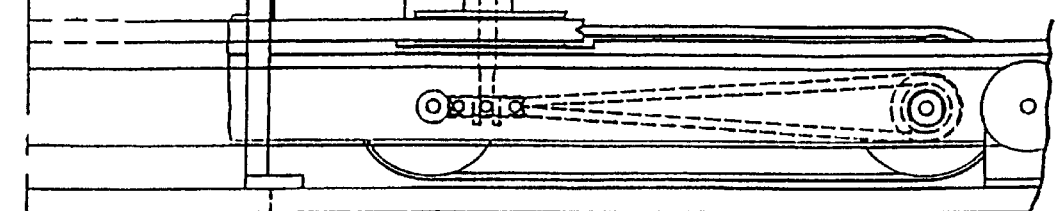

Referring to FIG. 4, the system is driven by motor 150 and is coupled to the motor via belt 151. The belt 151 contacts pulleys 194 which, in turn drives shafts 191 that are directly coupled to pulleys 103, and indirectly to pulleys 111 via pulleys 149, belts 192 and shaft 161. Likewise, the unloading system is driven.

ALTERNATIVE EMBODIMENTS

It will be appreciated that, although specific embodiments of the invention have been described herein for purposes of illustration, various modifications may be made without departing from the spirit and scope of the invention. In particular, the number and position of the belts can be varied. Similarly, notches formed in belt teeth can be placed on other edges of the teeth. Means for propelling the belts may include any form of rotating machine or other mechanism. The loading and unloading system shown herein may be replaced with various custom made delivery systems and methods.

Accordingly, the scope of protection of this invention is limited only by the following claims and their equivalents.

We claim:

1. A processing system for processing an article having first and second tapered edges on first and second sides, respectively, said system comprising:

first and second belts each having a plurality of notched teeth, said notched teeth of each of said belts including both first and second planar angular surfaces and disposed such that only said first, planar angular surfaces of a subset of said notched teeth of said first belt engage and support only said tapered first edge of said article on said first side while providing a gap between said article and said second planar angular surfaces of said subset of said first belt while said first, planar angular surfaces of a subset of said notched teeth of said second belt engage and support only said second tapered edge of said second side of said article while also providing a gap between said article and said second planar angular surfaces of said subset of said second belt, thereby having substantially all of the external surfaces of said article exposed for processing, said first and second belts not holding said article in a tight manner.

2. The processing system of claim 1 wherein the notched teeth of the first belt and the notched teeth of the second belt support with notch edges the first and the second sides of the article, respectively, such that the article is suspended in space.

3. The processing system of claim 2 further including means for simultaneously propelling segments of each of the belts along substantially parallel paths such that the supported article is transported through said space for a predetermined distance.

4. The processing system of claim 3 wherein the parallel paths pass through a process area for transporting the article through the process area and for exposing the article to a process.

5. The processing system of claim 4 wherein the process includes a wet or dry manufacturing process for cleaning the article, for chemically treating the article, or for exposing the article to a heat source or to electromagnetic radiation.

6. A method of processing articles each having first and second tapered edges on first and second opposed sides, respectively, said method comprising:

a) counter-rotating first and second endless belts each having a plurality of notched teeth which converge around a first pair of pulleys to form an article receiving end of an article transport path and diverge around a second pair of pulleys to form an article delivery end of said article transport path, each of said notched teeth having first and second planar angular surfaces;

b) engaging said first and second tapered edges of said opposed sides of said article with only said first angular, planar surfaces of said notched teeth of both of said first and second belts between said converging notched teeth at said article receiving end of said article transport path so as to provide a gap above said article between said article and said second angular surfaces of both of said first and second belts to thereby leave substantially the entire external surface area of said article exposed for subsequent processing while not holding said article in a tight manner;

c) transporting said article between said belts through a processing area; and d) disengaging said first and second tapered edges of said article as said belts diverge at the delivery end of said article transport path.

7. The method according to claim 6 wherein the step c) of transporting said article includes the step of chemically treating said article in the processing area.

8. The method according to claim 6 wherein the step c) of transporting said article includes the step of exposing said article to electromagnetic radiation or to a heat source in the processing area.

9. The processing system of claim 1 further including a loading system for loading said article into said first and second belts, said loading system comprising at least two driven belt members.

10. The processing system of claim 9 further including drive means for driving said first and second belts, said drive means further including driving means for driving said two driven belt members of said loading system.

11. The processing system of claim 1 including an unloading system for unloading said article from said first and second belts, said unloading system comprising at least two driven belt members.

12. The processing system of claim 11 further including drive means for driving said first and second belts, said drive means further including driving means for driving said two driven belt members of said unloading system.

* * * * *